US011979128B2

(12) United States Patent
Johnson et al.

(10) Patent No.: US 11,979,128 B2
(45) Date of Patent: May 7, 2024

(54) SPACE EFFICIENT CONTROLLABLE SWITCH TYPE PHASE SHIFTER

(71) Applicant: Mixcomm, Inc., Chatham, NJ (US)

(72) Inventors: Manoj Johnson, Corvallis, OR (US); Arun Natarajan, Corvallis, OR (US); Harish Krishnaswamy, New York, NY (US)

(73) Assignee: Mixcomm, Inc., Chatham, NJ (US)

( * ) Notice: Subject to any disclaimer, the term of this patent is extended or adjusted under 35 U.S.C. 154(b) by 142 days.

(21) Appl. No.: 17/510,073

(22) Filed: Oct. 25, 2021

(65) Prior Publication Data
US 2022/0131530 A1  Apr. 28, 2022

Related U.S. Application Data

(60) Provisional application No. 63/106,330, filed on Oct. 27, 2020.

(51) Int. Cl.
*H03H 11/16*  (2006.01)
(52) U.S. Cl.
CPC ................... *H03H 11/16* (2013.01)
(58) Field of Classification Search
CPC ...................................... H03H 11/16
USPC ................................. 327/231, 256
See application file for complete search history.

(56) References Cited

U.S. PATENT DOCUMENTS

| 10,523,167 | B2 * | 12/2019 | Shimura | .................. H01P 1/22 |
| 10,566,952 | B1 | 2/2020 | Lin et al. | |
| 10,734,972 | B1 | 8/2020 | Lin et al. | |
| 11,627,024 | B2 * | 4/2023 | Ning | ...................... H03K 5/01 |
| | | | | 327/254 |
| 2019/0198957 | A1 | 6/2019 | Sharma | |

FOREIGN PATENT DOCUMENTS

CN  109802652 A  5/2019

OTHER PUBLICATIONS

International Search Report and Written Opinion of the International Searching Authority from PCT/US2021/056641, dated Jan. 27, 2022 pp. 1-8.

* cited by examiner

*Primary Examiner* — Hai L Nguyen
(74) *Attorney, Agent, or Firm* — Straub & Straub; Michael P. Straub; Stephen T. Straut

(57) ABSTRACT

Methods and apparatus for implementing a phase shifter in a space, e.g., chip surface area, efficient manner is described. In various embodiments a combination of switches, capacitors and a transformer are used in combination as a controllable phase shifter. In some embodiments the phase shifter supports a phase shift of 0 degrees or 180 degrees depending on the position of one or more switches. The mutual inductance of the transformer in at least some embodiments emulates one or more capacitors in a phase shift network making for an implementation that can be implemented on a semiconductor in an area efficient manner as compared to implementations using more capacitors and independent inductors.

12 Claims, 8 Drawing Sheets

| INDEPENDENT INDUCTOR BASED SWITCH TYPE PHASE SHIFTER CIRCUIT PARTS LIST / AREA USAGE TABLE | | | |
|---|---|---|---|
| COMPONENT ← 202 | PER COMPONENT AREA IN MICROMETERS SQUARED (µm2) ← 204 | NUMBER OF INSTANCES OF COMPONENT ← 206 | TOTAL AREA IN MICROMETERS SQUARED (µm2) ← 208 |
| FIRST TYPE SWITCH (SW1) ← 210 | 2000 | 1 | 2000 |
| SECOND TYPE SWITCH (SW2 OR SW3) ← 212 | 2000 | 2 | 4000 |
| CAPACITOR WITH VALUE $C_A$ ← 214 | 2800 | 2 | 5600 |
| CAPACITOR WITH VALUE $C_B$ ← 216 | 2800 | 2 | 5600 |
| INDUCTOR WITH VALUE $L_A$ ← 218 | 26300 | 2 | 52600 |
| DESIGN OVERHEAD OF APPROX. 20% ← 220 | 14000 | 1 | 14000 |
| TOTAL AREA OF PHASE SHIFTER CIRCUIT ← 222 | | | 83800 |

FIGURE 2

| TRANSFORMER BASED SWITCH TYPE PHASE SHIFTER CIRCUIT PARTS LIST / AREA USAGE TABLE | | | |
|---|---|---|---|
| COMPONENT | PER COMPONENT AREA IN MICROMETERS SQUARED (μm2) | NUMBER OF INSTANCES OF COMPONENT | TOTAL AREA IN MICROMETERS SQUARED (μm2) |
| FIRST TYPE SWITCH (SW1) | 2000 | 1 | 2000 |
| SECOND TYPE SWITCH (SW2 OR SW3) | 2000 | 2 | 4000 |
| CAPACITOR WITH VALUE $C_1$ | 2800 | 2 | 5600 |
| CAPACITOR WITH VALUE $C_2$ | 5000 | 1 | 5000 |
| TRANSFORMER | 19200 | 1 | 19200 |
| DESIGN OVERHEAD OF APPROX. 20% | 7200 | 1 | 7200 |
| TOTAL AREA OF PHASE SHIFTER CIRCUIT | | | 43000 |

FIGURE 4

SPACE EFFICIENT CONTROLLABLE SWITCH TYPE PHASE SHIFTER

RELATED APPLICATIONS

The present application claims the benefit of U.S. Provisional Application Ser. No. 63/106,330 filed Oct. 27, 2020 which is hereby expressly incorporated by reference in its entirety.

FIELD

The present application relates to methods and apparatus for implementing phase shifters and more particularly to controllable phase shifters capable of being implemented in a space efficient manner.

BACKGROUND

Communications systems often need to be able to change, e.g., shift, the phase of a signal that is being received or transmitted. This may be to facilitate efficient combining of received signal, e.g., received via different antenna elements, or to control the relationship between signals being transmitted by different antenna elements.

A switch type 180 degree phase shifter (STPS180) includes two parallel paths with 180 degrees relative phase difference between them, and only one path is connected from input to output at any point in time using control switches.

STPS180s are highly useful in RF-front-end integrated circuits (RF ICs) to achieve 180 degrees relative phase shifts in signal paths. Passive phase shifters are made of multiple capacitors and inductors and typically have a significant foot-print area, especially due to the inductors. It is desirable to have a low foot-print area for a STPS180 since multiple STPS180s are used in a single phased array chip.

The conventional approach is to use a 1-bit Reflection-Type Phase Shifter as a 180 degree phase shifter or to use two cascaded 90 degree switch-type Phase Shifters. The conventional approach requires two on-chip inductors to achieve 180 degrees variable phase shift.

FIG. 1 is a drawing of a known controllable switch type phase shifter circuit 100, e.g. which can be implemented and controlled to be switchable between 0 degrees phase shift and 180 degrees phase shift. Controllable switch type phase shifter 100 includes two cascaded 90 degree switch type phase shifters to achieve a STPS180, and requires two inductors. Controllable switch type phase shifter circuit includes an input 102, an output 104, three switches (SW1 106, SW2 108, SW3 110), two independent inductors (first inductor 112 having an inductance value LA, second inductor 114 having an inductance value LA), and four capacitors (first capacitor 116 having a capacitance value of CA, a second capacitor 118 having an capacitance value of CB, a third capacitor 120 having a capacitance value CB, and a fourth capacitor 122 having a capacitance value of CA), coupled together and to ground 124 as shown. The values of CA, LA, and CB can be, and sometimes are selected, such that each set of two capacitors and an inductor ((116, 118, 112), (120, 122, 114), provides 90 degrees phase shift, with two 90 degree phase shifters being cascaded produce 180 degrees of phase shift. It should be observed that controllable shift type phase shifter 100 includes two independent inductors (112, 114). Inductors typically take up a large proportion of the total amount of space used to implement a known switch type phase shifter.

Transmission arrays are one application which phase shifters are frequently used. In the case of transmission arrays intended to work in the microwave range it may be, and sometimes is, desirable to implement a transmission array using one or more chips in a space efficient manner. This allows for a compact communications device to be implemented which is often desirable for a wide variety of reasons.

Unfortunately existing controllable phase shifters tend to take up a fair amount of space on a semiconductor due to the number of capacitors and/or inductors used to implement a controllable phase shifter using known designs such as the one shown in FIG. 1.

In view of the above it should be appreciated that there is a need for controllable phase shifters that can be implemented in a more space efficient manner. In particular it would be desirable if a controllable phase shifter could be developed which required less semiconductor layer area to implement than the known design shown in FIG. 1.

SUMMARY

Methods and apparatus for implementing a phase shifter in a space, e.g., chip surface area, efficient manner is described. In various embodiments a combination of switches, capacitors and a transformer are used in combination as a controllable phase shifter. In some embodiments the phase shifter supports a phase shift of 0 degrees or 180 degrees depending on the position of one or more switches. The mutual inductance of the transformer in at least some embodiments emulates one or more capacitors in a phase shift network making for an implementation that can be implemented on a semiconductor in an area efficient manner. Phase shifters implemented in accordance with the invention can be implemented in many cases using a smaller chip surface area than the known design shown in FIG. 1.

An exemplary phase shifter, in accordance with some embodiments, comprises: an input; an output; a first communications path extending between the input and output, the first communications path including a first switch coupling the input to the output when in a closed state and interrupting the first signal path between the input and the output when in an open state; and a second communications path extending between said input and the output, said second communications path including a second switch, a transformer, and a third switch, said second and third switches allowing signals to pass between the input and output when in a closed state and isolating said second signal path from the input and output when in an open state.

While various features discussed in the summary are used in some embodiments it should be appreciated that not all features are required or necessary for all embodiments and the mention of features in the summary should in no way be interpreted as implying that the feature is necessary or critical for all embodiments.

Numerous additional features and embodiments are discussed in the detailed description which follows.

BRIEF DESCRIPTION OF THE FIGURES

FIG. 2 is a table which shows a parts list and area usage for an exemplary independent inductor based controllable switch type 180 degree phase shifter circuit, e.g. implemented in accordance with the circuit of FIG. 1.

FIG. 4 is table which shows a parts list and area usage for an exemplary transformer based switch type phase shifter circuit, e.g., an exemplary controllable transformer based switch type 180 degree phase shifter of FIG. 3 implemented in accordance with the present invention.

DETAILED DESCRIPTION

Figure 1:
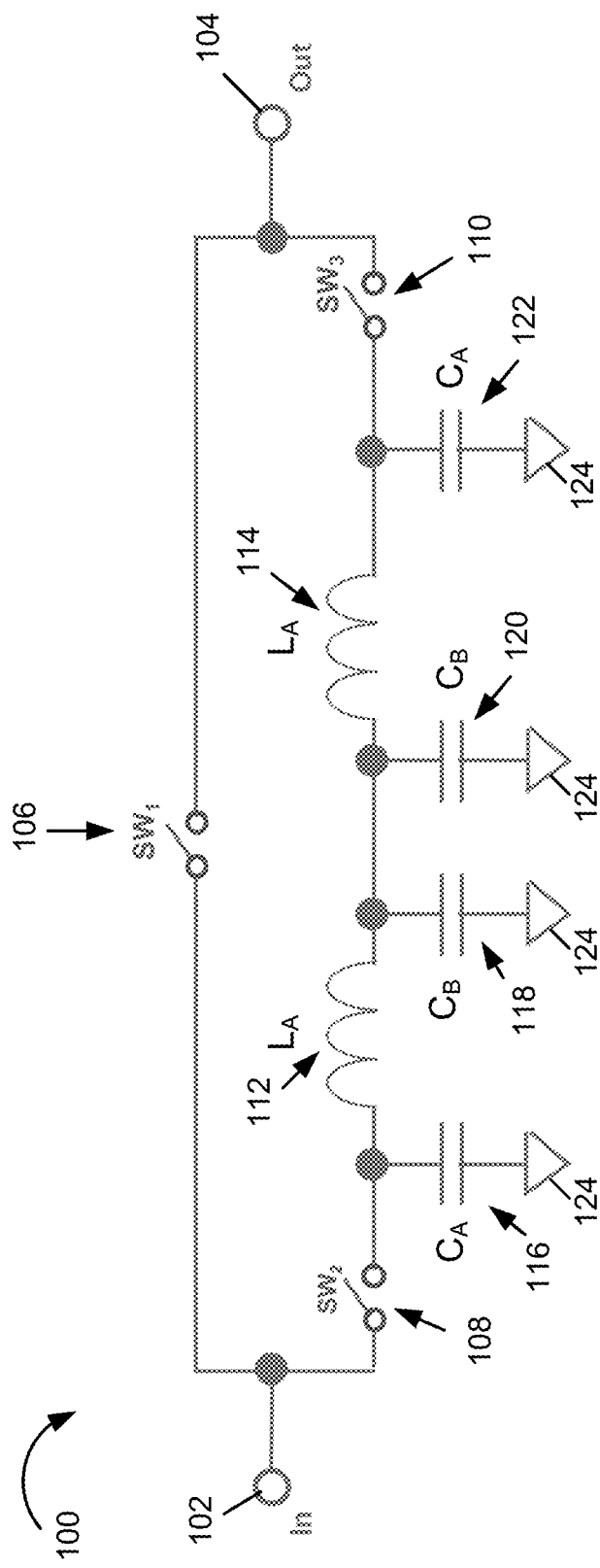
FIG. 1 is a drawing which shows a prior art controllable switch type 180 degree phase shifter circuit.

FIG. 2 is table 200 listing parts and area usage for an exemplary independent inductor based switch type phase shifter circuit, such as one implemented in accordance with the FIG. 1 design. The area numbers given in table 200 are for an implementation with operating frequency range of 27.5 GHz to 31 GHz and a center frequency of 29.2 GHz in 45 nm technology. First column 202 lists each component included in the independent inductor based switch type phase shifter circuit. Second column 204 includes information identifying, for each component, the per component are in micrometers squared (μm2). Third column 206 lists the number of instances of each component. Fourth column 206 includes, for each component, information identifying, a total area in micrometers squared (μm2) corresponding to the one or more instance of the component.

Row 210 indicates that there is one instance of the first type switch, which is SW1, that the first type switch occupies 2000 μm2, and the total area for first type switches is 2000 μm2. Row 212 indicates that there are two instances of the second type switch, which includes SW2 and SW3, that the second type switch occupies 2000 μm2, and the total area for second type switches is 4000 μm2. Row 214 indicates that there are two instances of a capacitor with capacitance value CA, that an individual capacitor with value CA occupies 2800 μm2, and the total area for capacitors with value CA is 5600 μm2. Row 216 indicates that there are two instances of a capacitor with capacitance value CB, that an individual capacitor with value CB occupies 2800 μm2, and the total area for capacitors with value CA is 5600 μm2. Row 218 indicates that there are two instances of an inductor with inductance value LA, that an individual inductor with value LA occupies 26300 μm2, and the total area for inductors with value LA is 52600 μm2.

Row 220 indicates that there is a design overhead of approximately 20% which amounts to a total area of 14000 μm2. Row 222 indicates that the total area of the exemplary independent inductor based controllable switch type phase shifter circuit is 83800 μm2.

Figure 3:
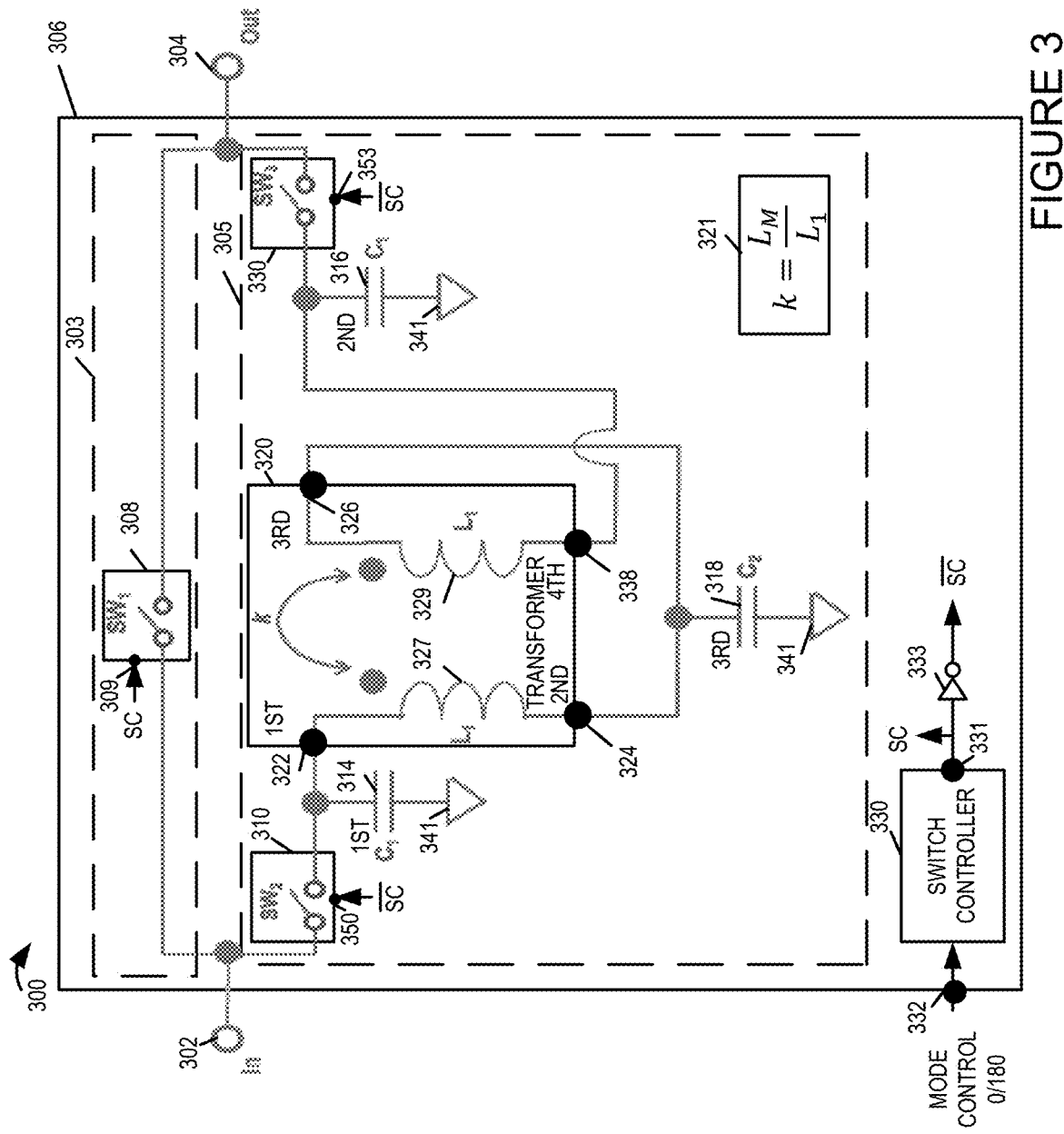
FIG. 3 illustrates a controllable phase shifter implemented in accordance with one exemplary embodiment of the invention.

FIG. 3 illustrates an exemplary phase shifter 300 implemented in accordance with the present invention. Box 306 represents a chip, e.g., one or more semiconductor layers, on which the phase shifter 300 is implemented. Through the use of a transformer 320 a compact phase shifter implementation, in terms of surface area, is achieved as compared to embodiments which use multiple separate inductors such as the system shown in FIG. 1.

The phase shifter 300 includes a signal input 302 and a signal output 304, first and second signal paths 303, 305, a switch controller 330 and a negation element 333. The first and second signal paths 303, 305 couple the input 302 to the output 304.

The first signal path includes a first switch 308 which couples the phase shifter input 302 to the phase shifter output 304. The first switch 308 includes a switch control signal input 309 which is coupled to a switch control signal output SC 331 of the switch controller 330. The switch controller 330 receives as an input a mode control signal supplied to a mode control input 332 of the phase shifter 300 which also serves as the mode control signal input to the switch controller 330. The mode control signal received at the mode control input 332 takes on one of two values, a first value representing a 0 degree phase shift is to be implemented, e.g., the 0 degree phase shift corresponding to the first signal path 303 is to be implemented and a second value indicating another phase shift, e.g., the 180 degree phase shift corresponding to the second signal path 305 is to be implemented. The switch controller 330 receives the mode control input signal and generates a corresponding switch control signal SC. Control signal SC is set to a voltage that causes switch SW1 308 to close when the mode control signal received by the switch controller 330 is to implement a 0 degree phase shift and to a voltage which causes switch SW1 308 to open when a non-zero, e.g., 180 degree phase shift is specified by the mode control signal SC. The switch control signal SC is subjected to a negation operation by negation element 333. This generates the switch control signal SCNOT, represented by SC with a bar over it in FIG. 3, which is supplied to a switch control input 350 of the second switch SW2 310 and to a switch control input 353 of the third switch SW3 330. The SCNOT signal has a value, e.g., expressed as a control voltage on the switch control signal input, which controls the second switch SW2 310 and third switch SW3 330 to be placed in a position opposite the position of the first switch SW1 308. In some cases the first, second, and third switches SW1 308, SW2 310 and SW3 330 are implemented as MOSFETs, e.g., N-type MOSFETs.

The first signal path 303 represents a 0 degree phase delay signal path, e.g., a straight through signal path, while the second signal path 305 represents a delayed signal path. In various embodiments the second signal path introduces a fixed amount of phase shift, e.g., 180 degrees of phase shift in some embodiments. However, in other embodiments other amounts of phase shift may be, and sometimes are, introduced by the second signal path 305.

In the FIG. 3 example, switches SW1 308, SW2 310, SW3 330 in the signal paths 303, 305, 305, respectively, are controlled so that only one of the two signal paths 303 or 305 is in use at any given time. Thus, in the case where second signal path 305 is controlled to be in use and introduce a 180 degree phase shift (switch SW2 310 and switch SW3 330 are controlled in be in closed position), the first signal path 303 is controlled to not be in use (switch SW1 308 is controlled to be in an open position). Alternatively, in the case where first signal path 303 is controlled to be in use and introduce a 0 degree phase shift (switch SW1 308 is controlled in be in closed position), second signal path 305 is controlled to not be in use (switch SW2 310 and switch SW3 330 are controlled to be in an open position).

The use of the second and third switches (SW2 310, SW3 330) on different ends of the second signal path 305 allows the elements of the second signal path 305 to be isolated from the input 302, output 304 and first signal path 303 when not in use. This prevents the capacitance and/or inductance elements of the second signal path 305 from affecting the signal passing through the phase shifter 300 when the second signal path 305 is not in use.

The second signal path 305 will now be discussed in detail. The second signal path includes the second switch SW2 310, a first capacitor 314, a transformer 320, a second capacitor 316, a third capacitor 318 and the third switch SW3 330. A first side of the second switch SW2 310 is coupled to the input 302 of the phase shifter 300. A second side of the second switch SW2 310 is coupled to a first side the first capacitor 314 and to a first terminal 322 of the transformer 320. The second side of the first capacitor 314 is coupled to ground 341.

The transformer 320 has four terminals, the first terminal 322, a second terminal 324, a third terminal 326 and a fourth terminal 338. A first inductor (primary coil) 327 which is a first side of the transformer 320 extends between the first terminal 322 and the second terminal 324 of the transformer 320. A second inductor (secondary coil) 329 which is the second side of the transformer 320 extends between the third terminal 326 and fourth terminal 338 of the transformer 320. In some embodiments the first and second inductors 327, 329 have the same inductance value L1. Box 321, indicates that for the transformer 320, k=LM/L1, where LM is the mutual inductance between the primary and secondary coils of the transformer 320.

The second terminal 324 of the transformer 320 is coupled to a first side of the third capacitor 318 and to the third terminal 326 of the transformer 320. Thus the windings which form the first and second sides of the transformer 320, and each have the inductance value L1 in the FIG. 3 example, are arranged in series with the third capacitor 318 coupling the series interconnect between the second and third terminals 324, 326 to ground 341. The fourth terminal 338 of the transformer 320 is coupled to a first side of the third switch SW3 330 and to a first side of the second capacitor 316. The second side of the second capacitor 316 is coupled to ground 341. The second side of the third switch SW3 330 is coupled to the output 304 of the phase shifter 300. In some embodiments the first and second capacitors 314, 316 have the same capacitance value C1 while the third capacitor 318 has a second capacitance value C2 which is different from the first capacitance value C1.

The use of the transformer 320 in combination with the first, second and third capacitors 314, 316, 318 allows for a physically compact 180 degree phase shifter which can be implemented using a relatively small area of a semiconductor chip as compared to some other designs. In operation, the transformer 320 (with primary and secondary coil inductances of L1 and having mutual inductance LM), with its negative terminal 324 of the primary winding 327 connected to the positive terminal 326 of its secondary winding 329, and further connected to capacitors 314, 316, 318 as shown, induces a 180 degree phase shift from input 302 to output 304, when switches SW2 310 and SW3 330 are controlled to be closed.

Operation will be explained via equivalent circuit models. (See FIGS. 5-8). The transformer 320 and its connections may be represented as an equivalent model circuit which includes 3 individual inductors (506, 508, 510) of values L1+LM, L1+LM, and −LM. Then the combination of the inductor (508) with value −LM may be combined with capacitor 318 (with value C2), to obtain a single capacitor (606) with an equivalent capacitor value (Ceff). Then the capacitor (606) with value Ceff is split in two, each capacitor (706, 708) having a value Ceff/2. In operation the portion of the signal path corresponding to the first side of the transformer which includes the equivalent circuit inductor (506) with inductance L1+LM that serves as a first inductor and the first capacitor 314, operating in combination with an equivalent circuit capacitor (708) with value Ceff/2, induces a 90 degree phase shift on the signal being communicated along the second signal path 305. Similarly the second half of the transformer which includes the equivalent circuit inductor (508) with inductance L1+LM that serves as a second inductor and the second capacitor 316, operating in combination with an equivalent circuit capacitor (710) with value Ceff/2, induces a second 90 degree phase shift on the signal being communicated along the second signal path 305. In combination these two 90 degree phase shifts achieve an overall 180 degree phase shift in the signal communicated along the second signal path 305.

It should be appreciated that the phase shifter 300 is a passive device which does not introduce a positive gain. The passive nature allows the functions of the signal input port 302 and signal output port 304 to be reversed with signals being able to pass in either direction through the phase shifter 300. The space efficient design of the passive phase shifter 300 is well suited for use in transmitter and/or receiver arrays, e.g., transceiver arrays, where it can be desirable to include multiple 0/180 degree phase shifters on a single chip, e.g., to support phase arrays in communications devices.

FIG. 4 is table 400 listing parts and area usage for an exemplary transformer based controllable switch type phase shifter circuit, e.g., an exemplary controllable transformer based switch type 180 degree phase shifter 300 of FIG. 3 implemented in accordance with the present invention. The area numbers given in table 400 are for an implementation with operating frequency range of 27.5 GHz to 31 GHz and a center frequency of 29.2 GHz in 45 nm technology. First column 402 lists each component included in the controllable transformer based switch type phase shifter circuit. Second column 404 includes information identifying, for each component, the per component are in micrometers squared (µm2). Third column 406 lists the number of instances of each component. Fourth column 406 includes, for each component, information identifying, a total area in micrometers squared (µm2) corresponding to the one or more instance of the component.

Row 410 indicates that there is one instance of the first type switch, which is SW1 308, that the first type switch occupies 2000 µm2, and the total area for first type switches is 2000 µm2. Row 412 indicates that there are two instances of the second type switch, which includes SW2 310 and SW3 330, that a second type switch occupies 2000 µm2, and the total area for second type switches is 4000 µm2. Row 414 indicates that there are two instances (314, 316) of a capacitor with capacitance value C1, that an individual capacitor with value C1 occupies 2800 µm2, and the total area for capacitors with value C1 is 5600 µm2. Row 416 indicates that there is one instance of a capacitor with capacitance value C2, that an individual capacitor with value C2 occupies 5000 µm2, and the total area for capacitors with value C2 is 5000 µm2. Row 418 indicates that there is one transformer (320), that the individual transformer occupies 19200 µm2, and the total area for the transformer is 19200 µm2.

Row 420 indicates that there is a design overhead of approximately 20% which amounts to a total area of 7200 µm2, Row 422 indicates that the total area of the exemplary transformer based controllable switch type phase shifter circuit is 43000 µm2.

Figure 5:
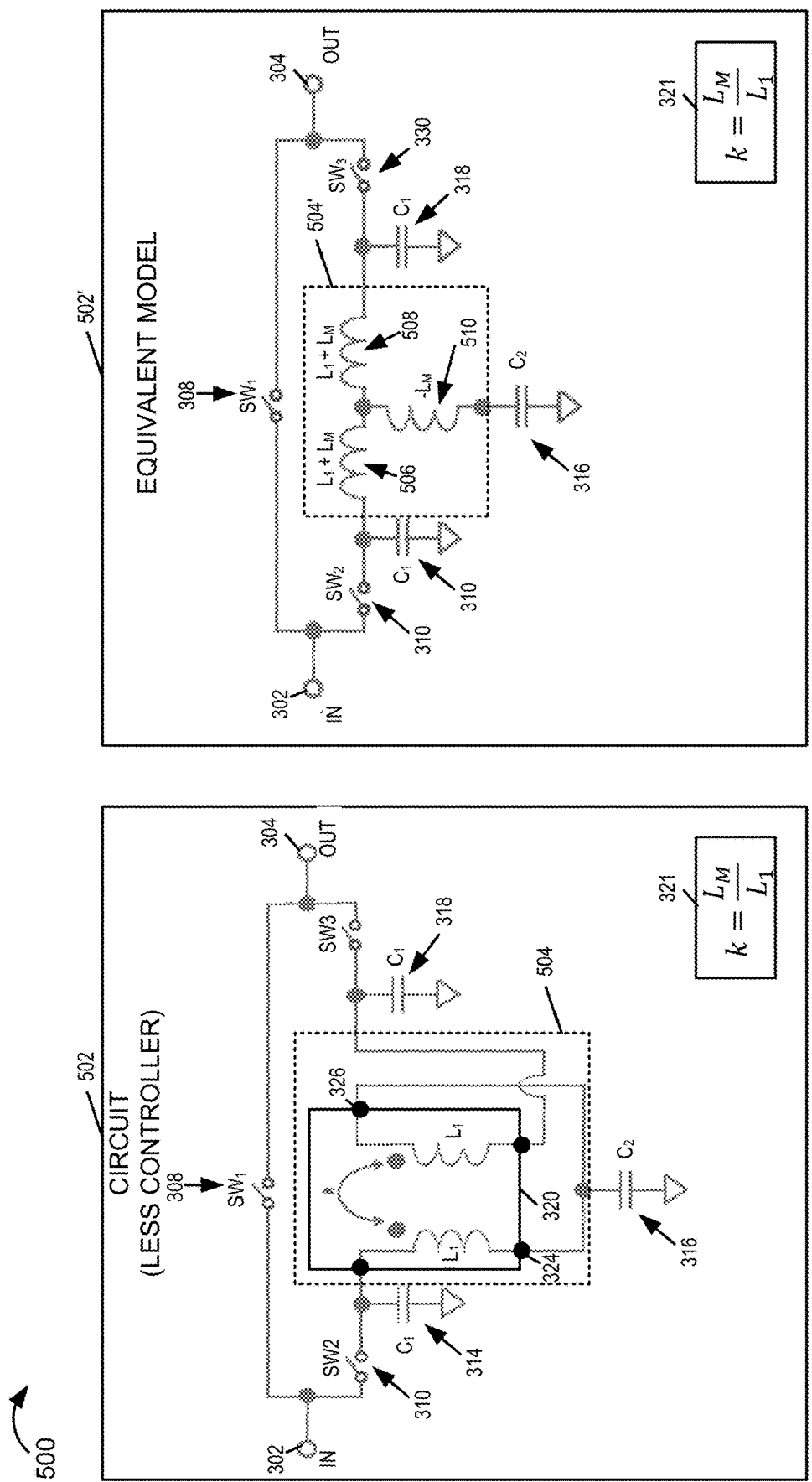
FIG. 5 includes a drawing which includes an exemplary circuit, which is exemplary transformer based switch type controllable phase shifter circuit of FIG. 3 less the controller, and a corresponding equivalent model, which illustrates replacement of a transformer and connections by three inductors, wherein one of the three inductors has a negative inductance value.

FIG. 5 includes drawing 400 which includes exemplary circuit 502, which is exemplary transformer based switch type controllable phase shifter circuit 300 of FIG. 3 less the controller, and a corresponding equivalent model 502'. Area 504 in circuit 502, which includes the transformer 320 and connections, corresponds to area 504' in equivalent model 502'. Area 504' includes two independent inductors 506, 508, each with an inductance value of L1+LM, and inductor 510, with an inductor value of −LM, coupled together as shown. LM is the mutual inductance between primary and secondary coils of the transformer 320 and negative polarity is achieved by shorting the negative terminal 324 of the primary to the positive terminal 326 of the secondary.

Figure 6:
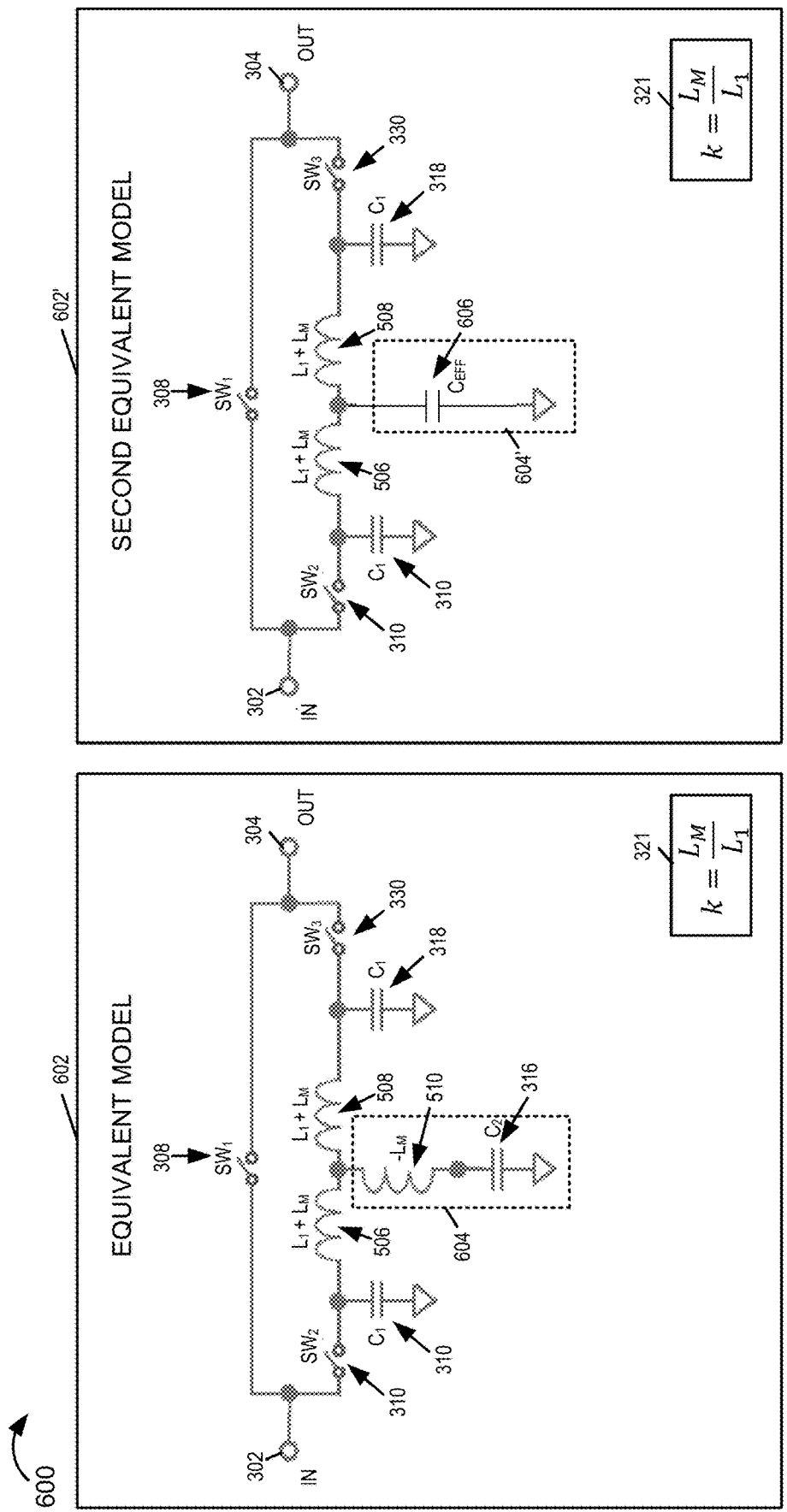
FIG. 6 includes a drawing including two equivalent model drawings of the exemplary transformer based switch type controllable phase shifter circuit of FIG. 3, which illustrates replacement of an inductor with a negative inductance value in series with a capacitor, by an equivalent capacitor.

FIG. 6 includes drawing 600 including equivalent model drawing 602 and corresponding exemplary second equivalent model drawing 602'. Equivalent model drawing 602 is the same as equivalent model drawing 502' of FIG. 5; however, in drawing 602 area 604 has been identified for replacement. Area 604 includes inductor 510 with an inductance value of −LM in series with capacitor 316 with capacitor value C2. In second equivalent model drawing 602', box 604', which replaces box 604 of drawing 602, includes capacitor 606 with capacitor value CEFF. In equivalent modeling, a capacitor is equivalent to and can be replaced by a negative inductor at a fixed frequency.

$$\frac{1}{j\omega_0 C_{eff}} = \frac{1}{j\omega_0 C_2} - j\omega_0 L_M$$

Figure 7:
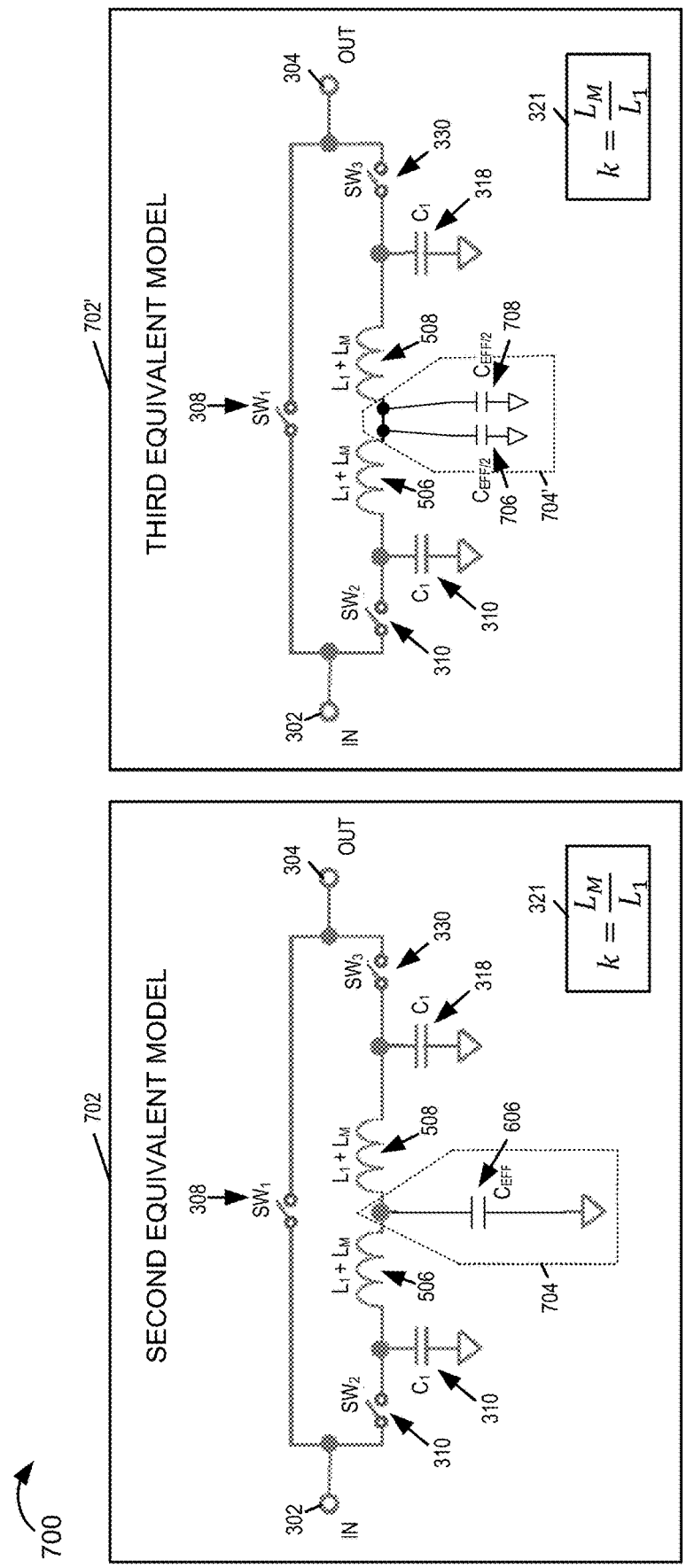
FIG. 7 includes drawing including two equivalent model drawings of the exemplary transformer based switch type controllable phase shifter circuit of FIG. 3, which illustrates replacement of a single capacitor by two capacitors in parallel.

FIG. 7 includes drawing 700 including second equivalent model drawing 702 and corresponding exemplary third equivalent model drawing 702'. Second equivalent model drawing 702 is the same as second equivalent model drawing 602' of FIG. 6; however, in drawing 702 area 704 has been identified for replacement. Area 704 includes capacitor 606 with a capacitance value of CEFF. In third equivalent model drawing 702', box 704', which replaces box 704 of drawing 702, includes two capacitors 706, 708, in parallel, each with a capacitance value of CEFF 12.

Figure 8:
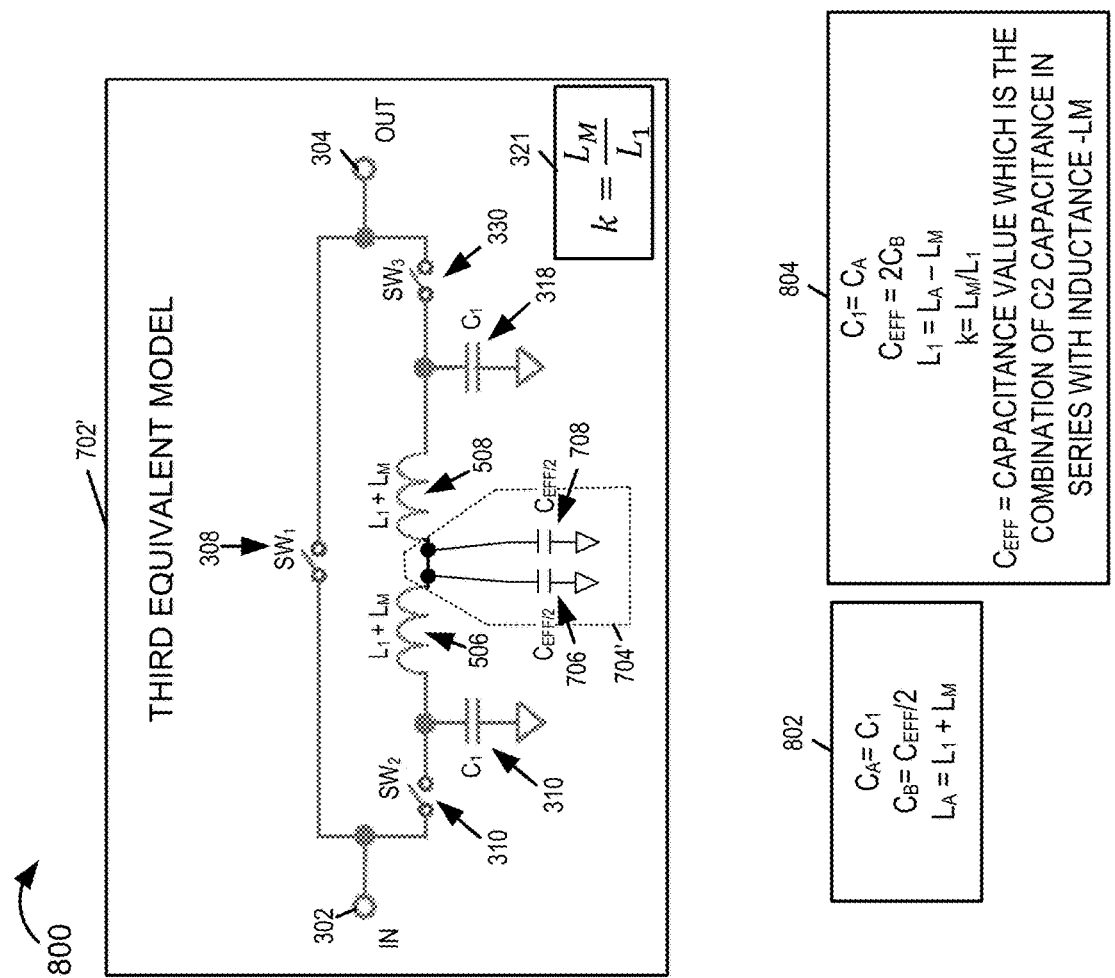
FIG. 8 illustrates an equivalent model drawing of the exemplary transformer based switch type controllable phase shifter circuit of FIG. 3 has the same basic components and interconnections of as the independent inductor based switch type controller phase shifter circuit of FIG. 1, provided the components are selected to satisfy the presented set of equations.

FIG. 8 includes drawing 800 including a drawing of third equivalent model 702' and information boxes 802, 804 indicating relationships between various components. It may be observed that the third equivalent model 702', which is a representation of the transformer based controllable switch type phase shifter circuit 300 of FIG. 3 of the present invention, has the same basic components and same connections as the individual inductor based controllable switch type phase shifter 100 of FIG. 1. Information box 802 indicates, e.g. by comparing third equivalent mode 702' to circuit 100, that there is equivalency (between circuit 100 of FIG. 1 and circuit 300 of FIG. 3), when: i) capacitance value CA is the same as capacitance C1, ii) capacitance CB is the same as CEFF/2, and the inductance value LA is the same as inductance value L1+LM. Box 804 includes formulas and information used to design a controllable transformer based switch type (180 degree) phase shifter, in accordance with the present invention, which can be used in place of an controllable independent inductor based switch type (180 degree) phase shifter. The novel transformer based design, in accordance with the present invention, is more compact, than the known implementation.

Various aspects and/or features of the some embodiments of the present invention are discussed below. Various embodiments, are directed to space efficient switch type phase shifters, e.g., a space efficient STPS 180. In some embodiments, a single on-chip transformer and three capacitors are used along with MOSFET switches to achieve an equivalent circuit of two cascaded Switch type 90 degree phase shifters (a STPS 180), thus saving the area which would otherwise be required for an additional inductor.

Network analysis of an exemplary transformer based switch type 180 degree phase shifter of FIG. 3, in accordance with the present invention, shows that it can be equivalent to the network of FIG. 1 around a range of frequencies. The top path 3 is a bypass through switch SW1 308. Bottom path 305 includes a transformer 320 with negative terminal 324 of the primary inductor 327 connected to the positive terminal 326 of the secondary inductor 329 and ground through a capacitor 318 (with value C2), along with shunt capacitors (314, 316), each with value C1, on both input 302 and output 304.

Thru careful design of transformer and capacitors, a 180 degree phase difference can be, and is, achieved between bottom and top paths (305, 303), while significant saving on area by using only one transformer 320 instead of two individual inductors.

In one exemplary embodiment, an exemplary controllable transformer based switch type 180 degree phase shifter implementation is targeted at 39 GHz. The center frequency is 39 GHz, and the design is considered to be acceptable within the range of 37 GHz to 41 GHz. Based on simulated performance, the variation in relative phase shift from 37 GHz to 41 GHz is below 6% and acceptable in most scenarios.

In another exemplary embodiment, an exemplary controllable transformer based switch type 180 degree phase shifter is targeted for 29.2 GHz. The center frequency is 29.2 GHz, and the design is considered to be acceptable within the range of 27.5 GHz to 31 GHz.

Most of the time, a transformer based 180 degree phase shifter, implemented in accordance with the present invention, is good enough for applications with a range center frequency+/−5% of center frequency.

NUMBERED LIST OF EXEMPLARY APPARATUS EMBODIMENTS

Apparatus Embodiment 1. A phase shifter (300), comprising: an input (302); an output (304); a first communications path (303) extending between the input (302) and output (304), the first communications path (303) including a first switch (308) coupling the input (302) to the output (304) when in a closed state and interrupting the first signal path (303) between the input (302) and the output (304) when in an open state; and a second communications path (305) extending between said input (302) and the output (304), said second communications path (305) including a second switch (310), a transformer (320), and a third switch (330), said second and third switches (310, 330) allowing signals to pass between the input (302) and output (304) when in a closed state and isolating said second signal path from the input (303) and output (304) when in an open state.

Apparatus Embodiment 2. The phase shifter (300) of Apparatus Embodiment 1, wherein said phase shifter is a controllable switch type 180 degree phase shifter (STPS180).

Apparatus Embodiment 3. The phase shifter (300) of Apparatus Embodiment 1, wherein a first side of said second switch (310) is coupled to the input (302) and a second side of said second switch is coupled to a first terminal (322) of said transformer (320), a second terminal of said transformer (320) being coupled to a third terminal (326) of said transformer (320) and a fourth terminal (338) of said transformer (320) being coupled to a first side of the third switch (330), a second side of the third switch (330) being coupled to the output (303).

Apparatus Embodiment 4. The phase shifter (300) of Apparatus Embodiment 3, wherein an inductor forming a first coil (327) corresponding to a first side of said transformer (320) extends between said first (322) and second (324) terminals of the transformer (320) and a second coil (329) corresponding to a second side of said transformer (320) extends between said third (326) and fourth (228) terminals of said transformer (320).

Apparatus Embodiment 5. The phase shifter (300) of Apparatus Embodiment 4, wherein said phase shifter (300) and the transformer (320) included therein are mounted on a semiconductor layer (306).

Apparatus Embodiment 6. The phase shifter (300) of Apparatus Embodiment 4, further comprising: a first capacitor (314) coupling said first terminal (322) of said transformer (320) to ground (341); and a second capacitor (316) coupling said third terminal (326) of the transformer (320) to ground (341).

Apparatus Embodiment 7. The phase shifter (300) of Apparatus Embodiment 6, wherein the first and second capacitors (314, 316) have the same capacitance (C1).

Apparatus Embodiment 8. The phase shifter of Apparatus Embodiment 6, further comprising: a third capacitor (318) coupling said second (324) and third terminals (326) of said transformer (320) to ground (341).

Apparatus Embodiment 9. The phase shifter (300) of Apparatus Embodiment 8, wherein the first and second capacitors (314, 316) have the same capacitance (C1), wherein the third capacitor (318) has a second capacitance (C2), said second capacitance being different from the first capacitance, and wherein the first and second coils (327, 329) have the same inductance (L1).

Apparatus Embodiment 10. The phase shifter (300) of Apparatus Embodiment 9, wherein said first signal path (303) introduces a 0 degree phase shift into signals communicated along said first signal path (303); and wherein said second signal path (305) introduces a 180 degree phase shift into signals communicated along said second signal path (305).

Apparatus Embodiment 11. The phase shifter (300) of Apparatus Embodiment 3, wherein the first switch (308) has a first switch control input (309), the second switch (310) has a second switch control input (350) and the third switch (330) has a third switch control input (353).

Apparatus Embodiment 12. The phase shifter (300) of Apparatus Embodiment 11, further comprising: a switch controller (330) controlling the state of said first, second and third switches (308, 310, 330) based on a mode control input signal, said switch controller (330) controlling the first switch (308) to be in a closed state and the second and third switches (310, 330) to be in an open state when the switch controller (330) receives a mode control input (332) indicating a 0 degree phase shift is to be induced in signals passing through the phase shifter; and controlling the first switch (308) to be in an open state and the second and third switches (310, 330) to be in a closed state when the switch controller (330) receives a mode control input (332) indicating a 180 degree phase shift is to be induced in signals passing through the phase shifter (300).

Apparatus Embodiment 13. The phase shifter (300) of Apparatus Embodiment 11, wherein the switch controller (330) includes a switch control signal output (331) for outputting a one bit switch control signal; and wherein the switch control signal output (331) is coupled to the switch control input (309) of the first switch (308) and wherein the switch control signal output (331) is further coupled to the switch control inputs of the second (310) and third (330) switches, a signal negation element (333) being used to perform the coupling to the switch control signal input (304) of the first switch (308) or to the switch control signal inputs (350, 353) of the second and third switches (310, 330) thereby causing the first switch (308) to receive a control signal (SC) which is opposite the control value supplied to the second and third switches (310, 330).

The techniques of various embodiments may be implemented using software, hardware and/or a combination of software and hardware. Various embodiments are directed to apparatus and/or systems, e.g., wireless communications systems, wireless terminals, user equipment (UE) devices, access points, e.g., a WiFi wireless access point, a cellular wireless AP, e.g., an eNB or gNB, user equipment (UE) devices, a wireless cellular systems, e.g., a cellular system, WiFi networks, etc. Various embodiments are also directed to methods, e.g., method of controlling and/or operating a system or device, e.g., a communications system, an access point, a base station, a wireless terminal, a UE device, etc. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. The configuration of the processor may be achieved by using one or more components, e.g., software components, to control processor configuration and/or by including hardware in the processor, e.g., hardware components, to perform the recited steps and/or control processor configuration. Accordingly, some but not all embodiments are directed to a device, e.g., access point, with a processor which includes a component corresponding to each of the steps of the various described methods performed by the device in which the processor is included. In some but not all embodiments a device, e.g., wireless communications node such as an access point or base station, includes a component corresponding to each of the steps of the various described methods performed by the device in which the processor is included. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g., one or more steps described above. Depending on the embodiment, the computer program product can, and sometimes does, include different code for each step to be performed. Thus, the computer program product may, and sometimes does, include code for each individual step of a method, e.g., a method of controlling a wireless communications device such as an access point. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a wireless communications device such as an access point described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A phase shifter comprising:
an input;
an output;
a first communications path extending between the input and output, the first communications path including a first switch coupling the input to the output when in a closed state and interrupting the first signal path between the input and the output when in an open state;
a second communications path extending between said input and the output, said second communications path including a second switch, a transformer including a first coil and a second coil, and a third switch, said second and third switches allowing signals to pass between the input and output when in a closed state and isolating said second signal path, and the first and second coils included in said transformer which is part of said second communications path, from the input and output when in an open state; and
wherein a first side of said second switch is coupled to the input and a second side of said second switch is coupled to a first terminal of said transformer, a second terminal of said transformer being coupled to a third terminal of said transformer and a fourth terminal of said transformer being coupled to a first side of the third switch, a second side of the third switch being coupled to the output.

2. The phase shifter of claim 1, wherein said phase shifter is a controllable switch type 180 degree phase shifter.

3. The phase shifter of claim 1, wherein an inductor forming a first coil corresponding to a first side of said transformer extends between said first and second terminals of the transformer and a second coil corresponding to a second side of said transformer extends between said third and fourth terminals of said transformer.

4. The phase shifter of claim 3, wherein said phase shifter and the transformer included therein are mounted on a semiconductor layer.

5. The phase shifter of claim 3, further comprising:
a first capacitor coupling said first terminal of said transformer to ground; and
a second capacitor coupling said third terminal of the transformer to ground.

6. The phase shifter of claim 5, wherein the first and second capacitors have the same capacitance.

7. The phase shifter of claim 5, further comprising: a third capacitor coupling said second and third terminals of said transformer to ground.

8. The phase shifter of claim 7,
wherein the first and second capacitors have the same capacitance, said same capacitance being a first capacitance,
wherein the third capacitor has a second capacitance, said second capacitance being different from the first capacitance, and
wherein the first and second coils have the same inductance.

9. The phase shifter of claim 8,
wherein said first signal path introduces a 0 degree phase shift into signals communicated along said first signal path; and
wherein said second signal path introduces a 180 degree phase shift into signals communicated along said second signal path.

10. The phase shifter of claim 1, wherein the first switch has a first switch control input, the second switch has a second switch control input and the third switch has a third switch control input.

11. The phase shifter of claim 10, further comprising:
a switch controller controlling the state of said first, second and third switches based on a mode control input signal, said switch controller controlling the first switch to be in a closed state and the second and third switches to be in an open state when the switch controller receives a mode control input indicating a 0 degree phase shift is to be induced in signals passing through the phase shifter; and
controlling the first switch to be in an open state and the second and third switches to be in a closed state when the switch controller receives a mode control input indicating a 180 degree phase shift is to be induced in signals passing through the phase shifter.

12. The phase shifter of claim 10,
wherein the switch controller includes a switch control signal output for outputting a one-bit switch control signal; and
wherein the switch control signal output is coupled to the switch control input of the first switch and wherein the switch control signal output is further coupled to the switch control inputs of the second and third switches, a signal negation element being used to perform the coupling to the switch control signal input of the first switch or to the switch control signal inputs of the second and third switches thereby causing the first switch to receive a control signal which is opposite the control value supplied to the second and third switches.

\* \* \* \* \*